United States Patent [19]

Bol

[11] Patent Number: 5,417,801

[45] Date of Patent: May 23, 1995

[54] PROCESS TO MANUFACTURE BUSHINGS FOR MICROMECHANICAL ELEMENTS

[75] Inventor: Igor I. Bol, Sherman Oaks, Calif.

[73] Assignee: Xerox Corporation, Stamford, Conn.

[21] Appl. No.: 83,226

[22] Filed: Jun. 29, 1993

[51] Int. Cl.[6] .......................................... H01L 21/302
[52] U.S. Cl. ..................................... 216/2; 310/309;
310/40 MM; 216/46
[58] Field of Search ..................... 156/656, 653, 657;
310/40 MM, 309, 42

[56] References Cited

U.S. PATENT DOCUMENTS

| | | | |
|---|---|---|---|
| 4,943,750 | 7/1990 | Howe et al. | 310/309 |
| 4,997,521 | 3/1991 | Howe et al. | 156/657 |
| 5,043,043 | 8/1991 | How et al. | 156/657 |
| 5,149,397 | 9/1992 | Bol | 156/653 |
| 5,151,153 | 9/1992 | Bol | 156/657 |
| 5,191,251 | 3/1993 | Paratte | 310/309 |
| 5,252,881 | 10/1993 | Muller et al. | 310/40 MM |
| 5,331,236 | 7/1994 | Sexton | 310/309 |

*Primary Examiner*—George Fourson
*Assistant Examiner*—Thomas G. Bilodeau
*Attorney, Agent, or Firm*—Nola Mae McBain

[57] ABSTRACT

A process in which micromechanical bushings can be made and the application of such process to making micromechanical devices. Bushings are made on a surface of a stationary structure extending from a planar surface. The bushings are separated from the stationary structure by a sacrificial layer. The stationary structure, the bushing and the planar surface are then further processed by coating with a second sacrificial layer, and a structural layer. The structural layer is patterned into a movable structure that is held onto the stationary structure by a curved, undercut edge such as gear on stool. Final processing includes removing both sacrificial layers to free the movable structure, the bushing, and the stationary structure from each other. The bushing is trapped between the movable structure and the stationary structure but able to move freely.

15 Claims, 8 Drawing Sheets

PROCESS TO MANUFACTURE BUSHINGS FOR MICROMECHANICAL ELEMENTS

This application is related to applicant's U.S. applications Ser. No. 7/725,174 Fabrication Methods for Micromechanical Elements issued as U.S. Pat. No. 5,149,397 and Ser. No. 07/725,176 Manufacture of a Suspended Micromechanical Element issued as U.S. Pat. No. 5,151,153, both filed Jul. 3, 1991.

BACKGROUND OF INVENTION

This invention relates generally to micromechanical elements such as movable joints, gears, and sliders and, more particularly, concerns fabrication methods for making high precision micromechanical elements with floating bushings.

Micromechanical elements with joints that slide or rotate have many uses in miniature pin joints, gears, cranks, slides, and other mechanisms. These elements can be made in a variety of ways. In U.S. Pat. No. 4,740,410 by Muller et al., micromechanical sliding or rotating elements are made by following the process steps of:

1) depositing a sacrificial layer of glass on a substrate,
2) depositing and forming a structural layer of polysilicon for the sliders or gears,
3) depositing a second sacrificial layer of glass,
4) depositing and forming a second structural layer of polysilicon for the rails or pins,
5) removing the sacrificial layers to free the gears and sliders from both the substrate and the pins and rails.

This process results in fixed axle pin joints or fixed rail sliders. Once loosened, the fixed gears and sliders rest on the substrate. In operation, undesirable amounts of friction are generated between the gears or sliders and the substrate.

SUMMARY OF THE INVENTION

Briefly stated and in accordance with the present invention, there is provided a process for making micromechanical floating bushings and application of that process to making micromechanical elements with floating bushings to reduce the friction between the micromechanical elements upon movement of them.

A first type of rotating micromechanical element is built on a substrate with a projecting pin or rail and with concave sides. Since the sides are concave, the pin is necked. A gear is formed around the pin so that it is restrained from lifting up and off the pin and a floating bushing is formed between the stationary pin and the moving gear. The process comprises first coating the top surface of the stationary pin with a sacrificial layer. The bushing is then formed on top of the sacrificial layer. A relatively uniform sacrificial layer is then coated over the stationary pin and the bushing. Then a structural layer is deposited on the uniform sacrificial layer. The gear is formed out of the structural layer, and then the sacrificial layers are etched away, releasing the gear from the pin and simultaneously releasing the bushing which is trapped between the gear and pin.

A second type of gear may also be built with this process. Instead of building a pin which projects outward from the substrate, a hole or depression that projects inward towards the substrate is built. The sides of the hole are again concave. Unlike the female gear described above, a sacrificial layer is provided surrounding the depression and the bushing is formed surrounding the depression. A second relatively uniform sacrificial layer is provided in the hole and on the bushing. A structural layer is then deposited on the second sacrificial layer and fabricated into a male gear. When the structural layer is removed, the gear is free to move within the confines of the hole and the bushing is free to rotate as well.

Both gears described above are complementary processes of each other. Using the same process steps, it is possible to create either a bushing surrounding the protruding pin in the first type of micromechanical element described or to create a bushing inside the depression of the second type of micromechanical element described.

DESCRIPTION OF THE INVENTION

Figure 1:
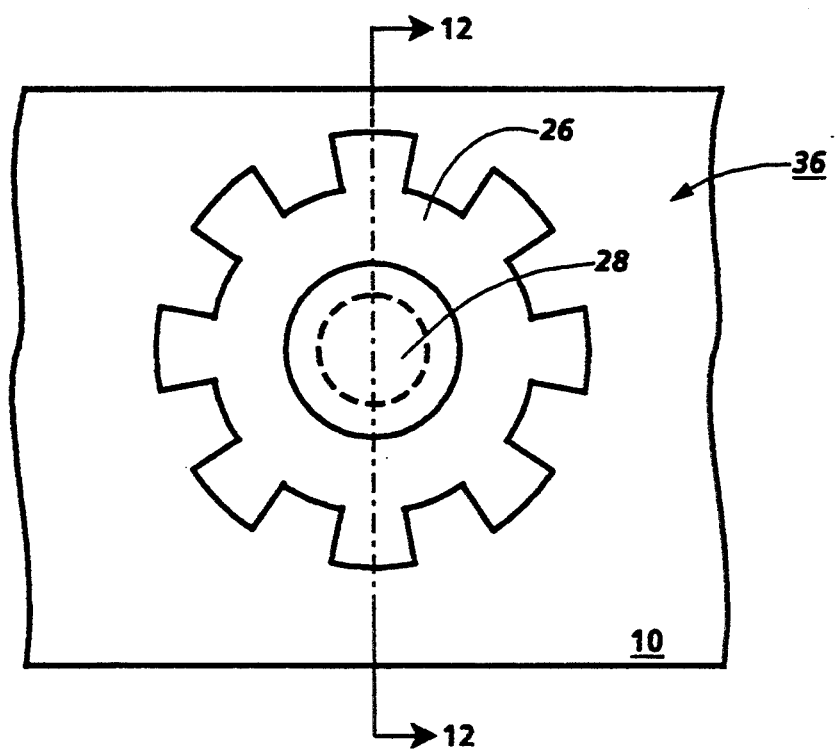
FIG. 1 shows a top view of a gear on a pin.

Turning now to FIG. 1; a top view of a gear 26 rotating around a pin 28 is shown. All of the process steps for deposition of materials, etching add patterning are known in the art. Therefore, the description will focus on the order and results of each step and not on the specific details required to perform each step.

The micromechanical elements are built upon a substrate. In this embodiment, silicon is used for the substrate. Silicon is ideal since it is not damaged during high temperature process steps. Other materials, such as ceramics or some metals, could be substituted.

Figure 2:
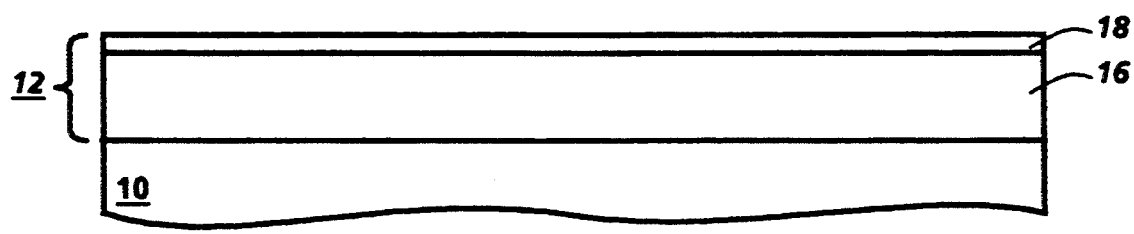
FIG. 2 shows a cross sectional view of a substrate after nitride deposition and doped polysilicon deposition to form a first structural layer.

FIG. 2 illustrates a substrate 10 after depositing a structural layer 12. The structural layer 12 is actually comprised of two layers: a doped polysilicon layer 16, and a second nitride layer 18.

Figure 3:
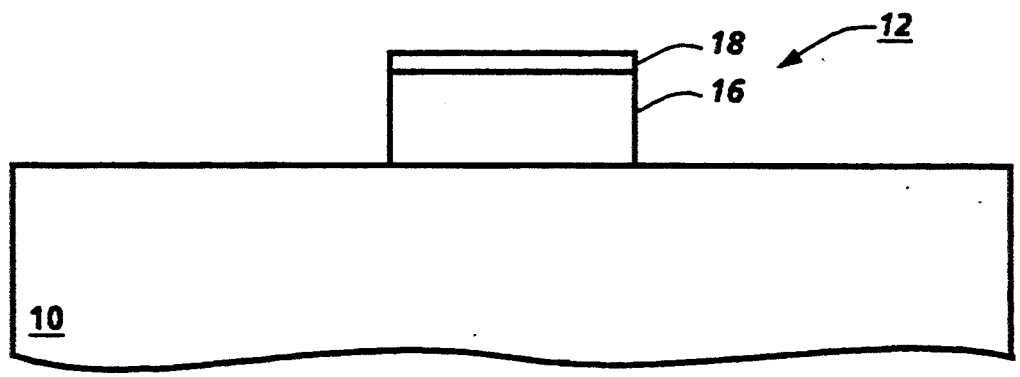
FIG. 3 shows a cross sectional view of the substrate of FIG. 2 after masking and etching the first structural layer.

The structural layer 12 undergoes a patterning phase and a bumper growing phase. The first is done using a conventional photoresist and etching process. The photoresist is used to define those areas that will become pins. Those areas of the structural layer 12 that will not become pins are completely etched away. When this step is completed, the remaining portion of the structural layer 12 will project or protrude from the surface of the substrate 10 as in FIG. 3. The projecting or protruding remains of the structural layer 12 will later become the pin 28 shown in FIG. 1.

Figure 4:
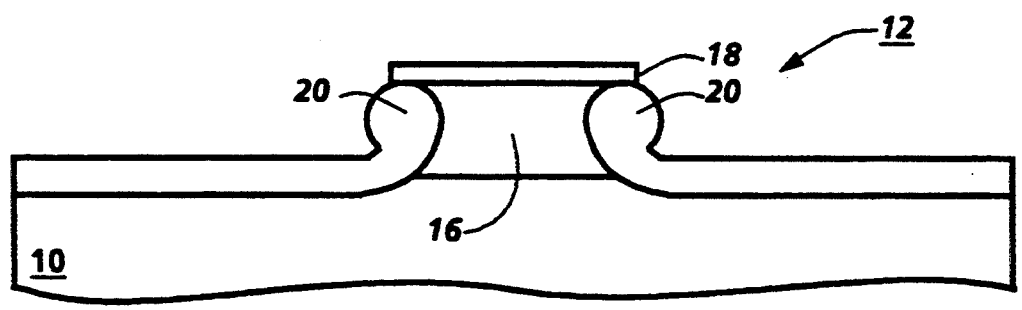
FIG. 4 shows a cross sectional view of the substrate of FIG. 3 after oxide bumpers are grown.

As shown in FIG. 4, the bumper growing phase commences with growing oxide bumpers. Oxide bumpers 20 are grown on the doped polysilicon layer 16 using a conventional oxidation process. The oxide grows on the exposed edge or wall of the doped polysilicon layer 16. The oxide bumper 20 grows both inward and outward in a curved shape since the constraints put on it from the nitride layer 18 control the shape of the bumper. The oxidation rate will be slowest at the interface of the doped polysilicon layer 16 with the nitride layers 18. The oxide bumpers 20 are grown until the profile of the oxide growth is convex and forming a convex-concave relationship with the doped polysilicon layer 16. Oxidation rates can be controlled by changing the dopant profile of the doped polysilicon layer 16 either by ion implantation or by controlling in situ dopant in the doped polysilicon layer 16. Since control of polysilicon oxidation rates is known, the depth and profile of the oxide bumper 20 can be precisely controlled. Therefore, the concave shape of the pin 28 profile shown in FIG. 1 can be precisely controlled. The growth and control of oxide bumpers is discussed in U.S. Pat. Nos. 4,400,866 and 4,375,643 by Bol and Keming, both titled Application of Grown Oxide Bumper Insulators to a High Speed VLSI SASMEFET, incorporated by reference herein.

Figure 5:
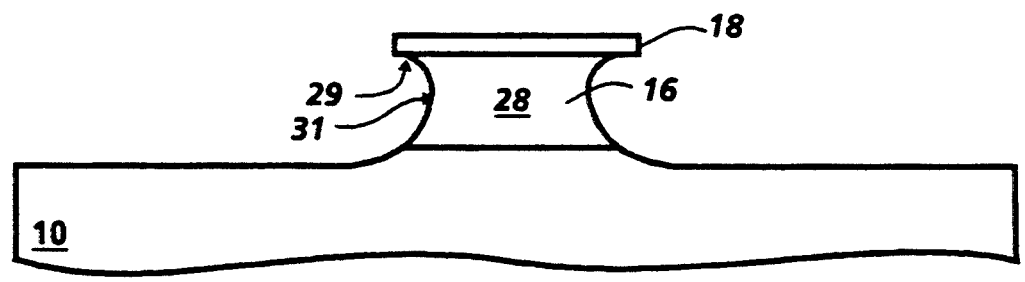
FIG. 5 shows a cross sectional view of the substrate of FIG. 4 after the oxide bumpers have been etched away.

Oxide removal as shown in FIG. 5 is the last step of patterning the first structural layer 12 which has become the pin 28 as shown in FIG. 1. The convexoconcave relationship of the oxide bumper 20 to the doped polysilicon layer 16 allows construction of a pin 28 with concave sides. Since the oxide bumpers had a convex profile, when they are etched away the resulting wall will have a concave profile. Any convexo-concave profile, where the oxide bumper 20 bulges outward and the doped polysilicon layer 16 bulges inward, where the head 29 of the pin 28 is larger than the body 31 of the pin 28 will work. Since the pin 28 is wider at the head 29, a gear can be constructed around the pin 28 that will be held on by the head 29 of the pin 28.

Figure 6:
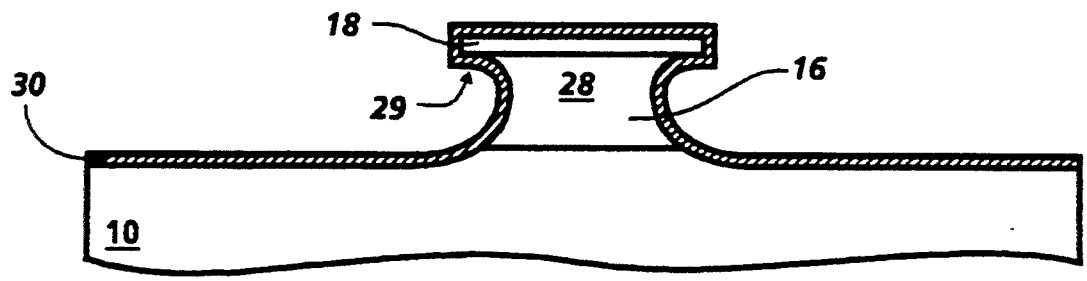
FIG. 6 shows a cross sectional view of the substrate of FIG. 5 after deposition of a first sacrificial layer.
Figure 7:
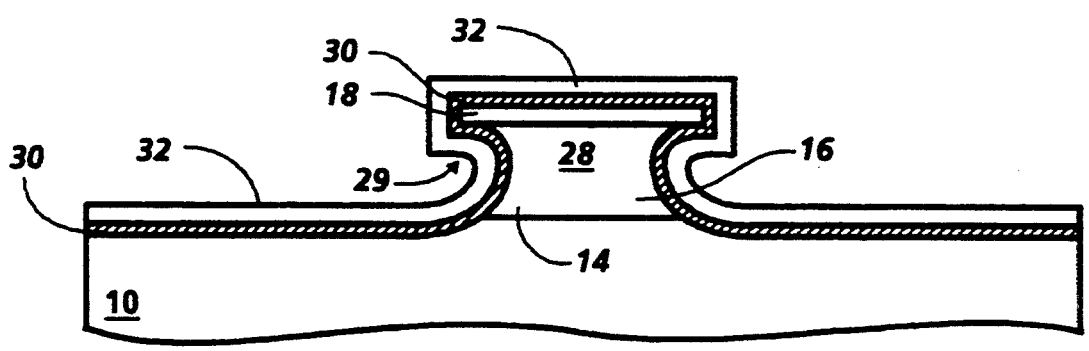
FIG. 7 shows a cross sectional view of the substrate of FIG. 6 after deposition of a bushing layer.
Figure 8:
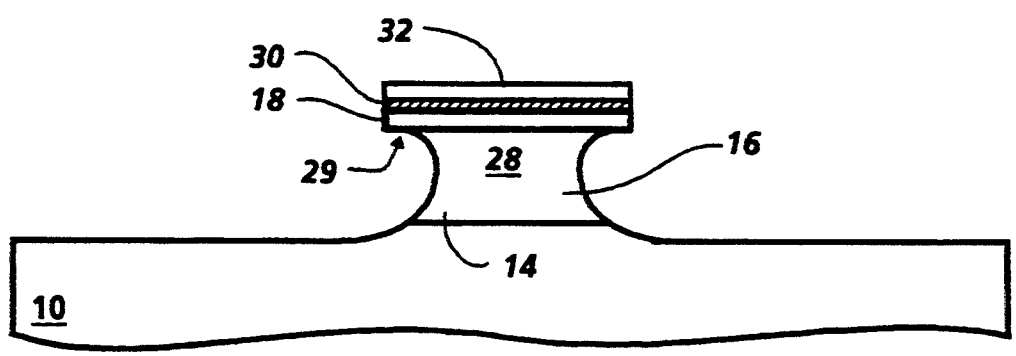
FIG. 8 shows a cross sectional view of the substrate of FIG. 7 after patterning of the first sacrificial layer and the bushing layer.

The structure is now ready for construction of the bushing. FIG. 6 shows deposition of a sacrificial layer 30 on all exposed surfaces of the pin 28 and the substrate 10. In the present process sequence the sacrificial layer is formed by an oxide deposition. FIG. 7 shows deposition of a bushing layer 32 on the sacrificial layer 30. In the present process the bushing layer 32 is formed by a nitride layer deposition. FIG. 8 shows the sacrificial layer 30 and the bushing layer 32 after patterning using either a wet or dry etch to form the bushing 32.

Figure 9:
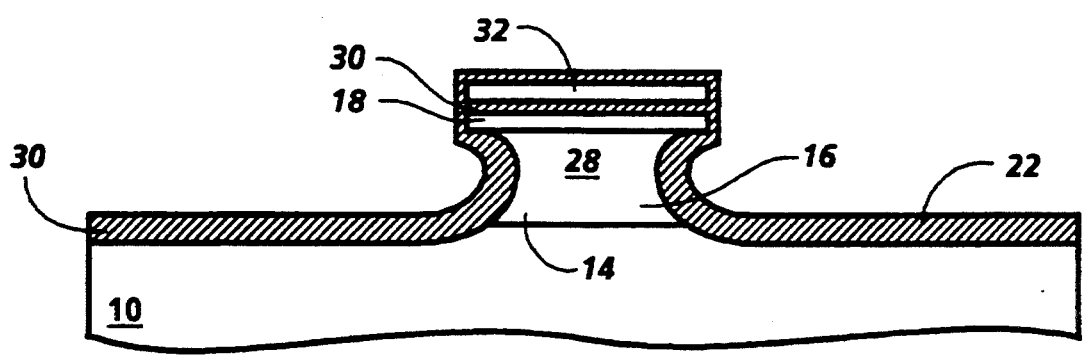
FIG. 9 shows a cross sectional view of the substrate of FIG. 8 after formation of a second sacrificial layer.

The next step is forming a sacrificial layer 22 as shown in FIG. 9. Oxide is grown on the surface of the substrate 10 and the sides of the pin 28 formed by layer 16 which are made from silicon and doped polysilicon respectively. Since the top surface of the pin 28 is nitride, no oxide can be grown there. To insure that the whole structure is covered with oxide, a TEOS oxide deposition is used after oxide has been grown on the substrate 10 and the side surfaces of the pin 28 formed by layer 16. The result is that the oxide layer on the top surface of the pin 28 is thinner than the oxide layer on the substrate 10 and the sides of the pin 28, as shown in FIG. 9.

Figure 10:
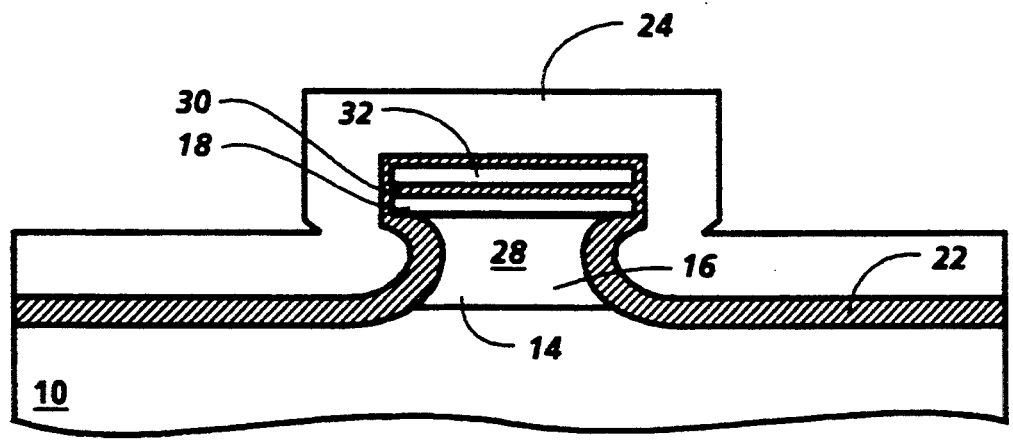
FIG. 10 shows a cross sectional view of the substrate of FIG. 9 after deposition of a second structural layer.

The structure is now ready for formation of a structural layer 24, as shown in FIG. 10. Polysilicon has been used in this embodiment although other materials may be substituted such as silicon, metals, or metal silicides. The structural layer 24 is separated from the pin 28 and the substrate 10 by the sacrificial layer 22 except at the top surface of the pin 28 where the structural layer 24 is separated from the pin 28 by the two sacrificial layers 30, 22 and the bushing layer 32 sandwiched between them.

Once the structural layer 24 has been deposited, it is ready for patterning to be finally formed into the gear 26 shown in FIG. 1. Conventional procedures of masking and etching that were used in previous steps to pattern the structural layer 12 are used again here to pattern the structural layer 24.

Figure 11:
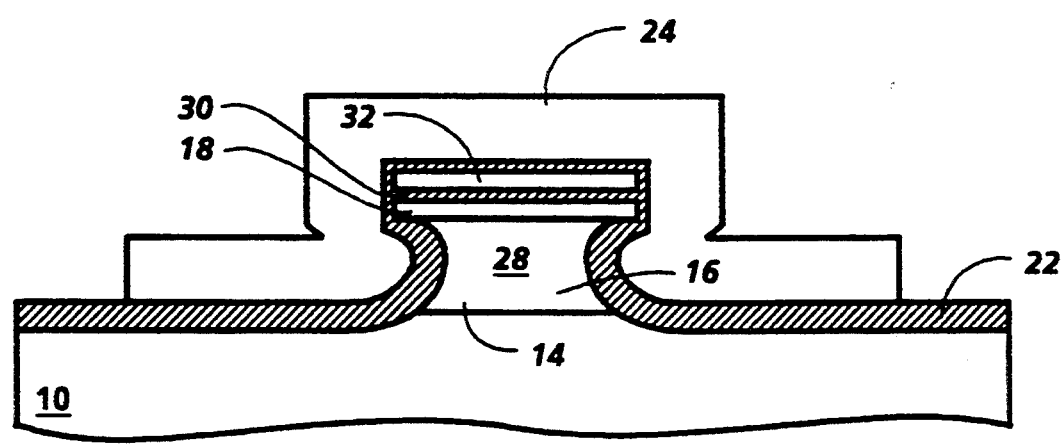
FIG. 11 shows a cross sectional view of the substrate of FIG. 10 after patterning the second structural layer.

FIG. 11 shows the device after patterning the structural layer 24. The gear 26 is now completed but still connected by the sacrificial layer 22 to the substrate 10 and the pin 28 as well as connected to the bushing layer 32 by the sacrificial layer 30.

Figure 12:
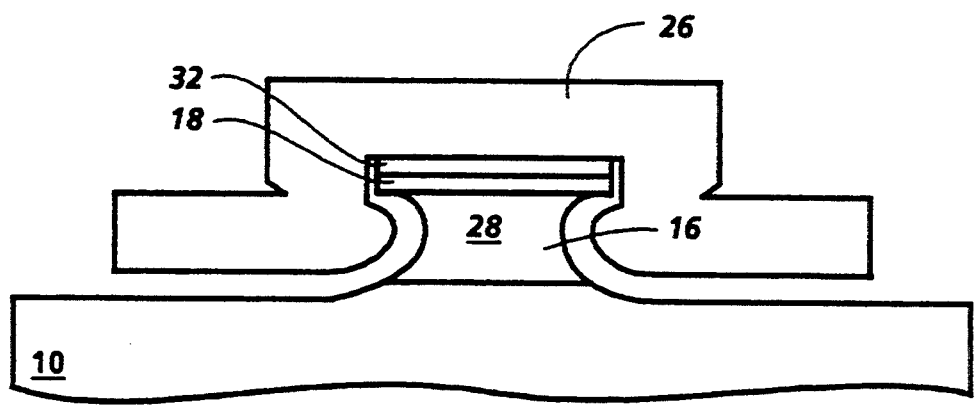
FIG. 12 is a cross sectional view of the completed gear shown in FIG. 1 taken through section line 12—12.

The final step, shown in FIG. 12, is removal of both sacrificial layers 22 and 30. In this embodiment an oxide etch is used to wash out the oxide used for both sacrificial layers 22 and 30. This step frees the gear 26 from the pin 28 and the substrate 10. The gear 26 may now rotate freely around the pin 28. This step also frees the bushing 32 sandwiched between the two sacrificial layers 28 and 30. The bushing 32 is trapped between the gear 26 and the pin 28 but able to move freely.

Since the sacrificial layer 22 was thicker on the sides of the pin 28 and the substrate 10, when the sacrificial layer 22 is etched away the gear 26 will rest on the pin 28 but will be suspended above the substrate 10 and constrained by, but separated from, the head 29 and body 31 of the pin 28. Having the gear 26 or the slider 30 held suspended above the substrate 10 eliminates the frictional component between the gear 26 and substrate 10 when in use.

The material for bushing 32 is chosen to minimize friction between the portion of head 29 of the pin 28 formed by layer 18 and the gear 26.

Figure 13:
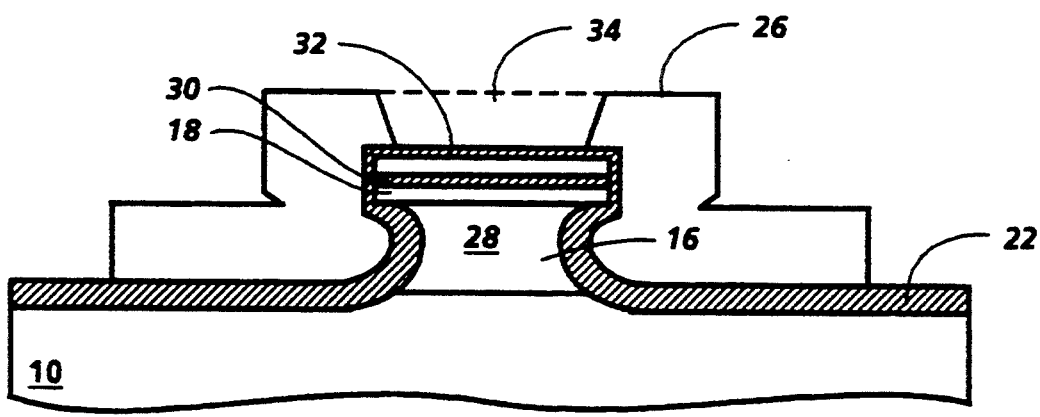
FIG. 13 is a cross sectional view of an alternative process step for FIG. 9.
Figure 14:
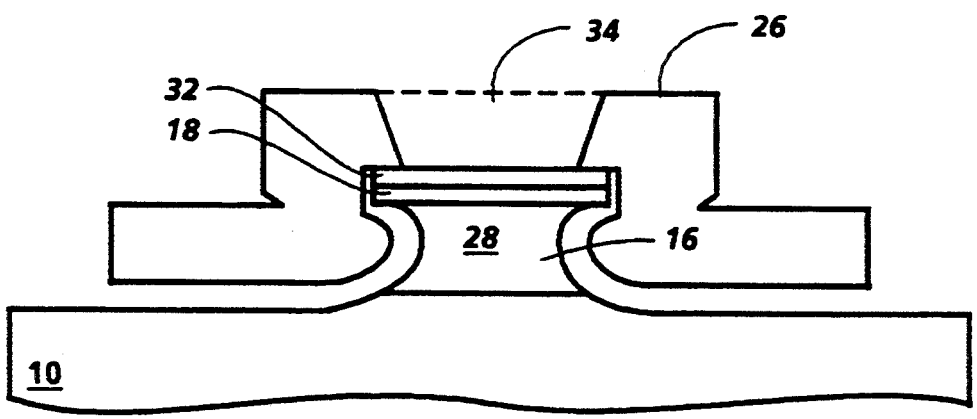
FIG. 14 is a cross section of an alternative gear or slider structure built using the alternative process steps shown in FIG. 13.

An alternative method for further reducing the friction of the parts is shown in FIGS. 13 and 14. The steps shown in these FIGS. replace the steps shown in FIGS. 10 and 11. When patterning the structural layer 24 to form the gear 26, the center portion 34 of the gear 26 may also be removed as is shown in FIG. 13. After the oxide etch, to wash out both sacrificial layers 22 and 30, is accomplished, the structure then appears as in FIG. 14. The removal of the center portion 34 minimizes contact between the gear 26 and the bushing 32, further reducing the friction when the gear 26 is in use.

Since silicon is capable of oxidation, it is possible to provide a thicker sacrificial layer on the substrate than on the top of the pin 28 to produce a gear or slider that is suspended above the substrate. However, when a substrate that does not oxidize is used this is not possible. Therefore, it might be necessary to use two bushings to reduce frictional forces. The second bushing would be formed using the same process steps and would surround the pin.

A second complementary embodiment utilizing depressions instead of pins can also be built and is shown in FIGS. 15–25. Equivalent parts of FIGS. 2–12 are given the same numbers only with an "a" affixed thereto.

Figure 15:
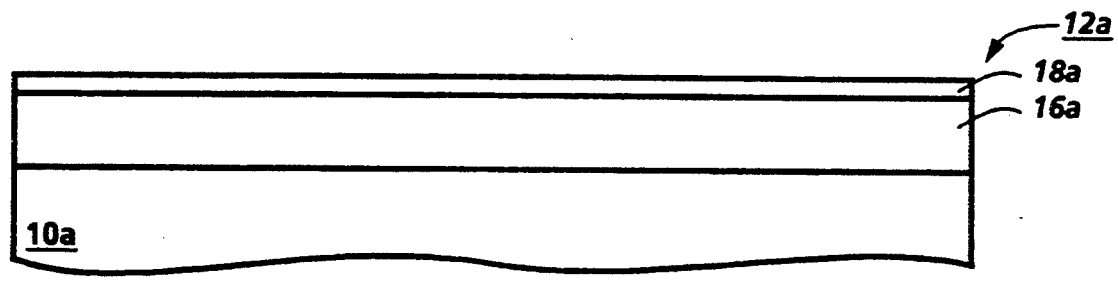
FIG. 15 shows a cross sectional view of a substrate after nitride deposition and doped polysilicon deposition to form a first structural layer.

FIG. 15 is identical to FIG. 2 in that it illustrates the substrate after deposition of the structural layer 12a which will be patterned to form a recess or depression therein.

Figure 16:
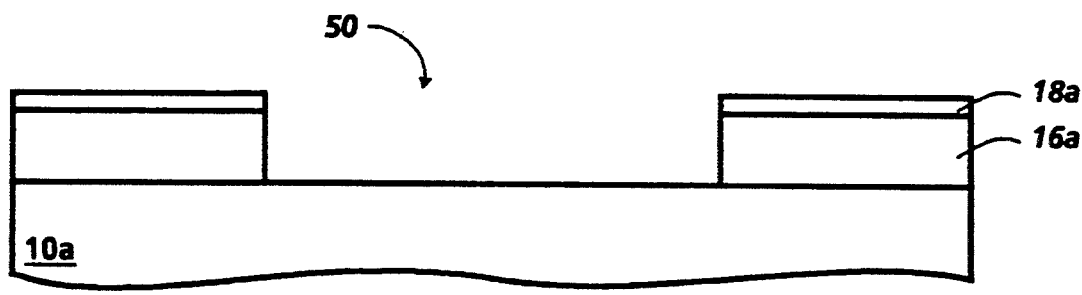
FIG. 16 shows a cross sectional view of the substrate of FIG. 15 after masking and etching the first structural layer.

FIG. 16 illustrates the first patterning phase. In contrast to FIG. 3, a depression 50 has been defined in the first structural layer. This depression 50 will later become the recessed retaining member.

Figure 17:
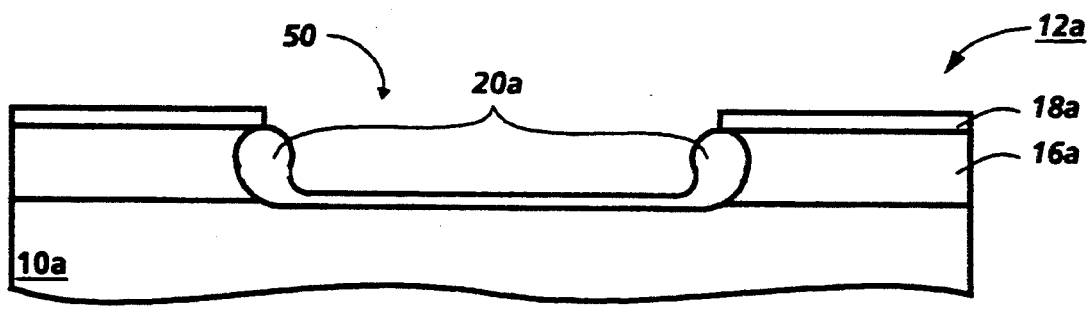
FIG. 17 shows a cross sectional view of the substrate of FIG. 16 after oxide bumpers are grown.
Figure 18:
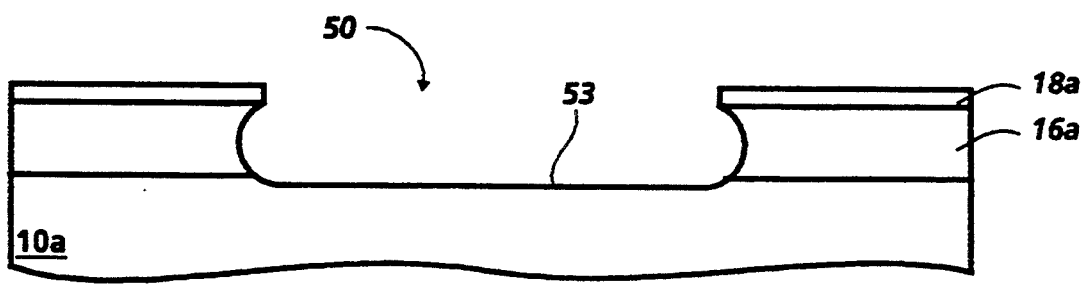
FIG. 18 shows a cross sectional view of the substrate of FIG. 17 after the oxide bumpers have been etched away.

Oxide bumpers 20a are grown and removed in FIGS. 17 and 18 identically as in FIGS. 4 and 5. The result is that the depression has an undercut or concave wall 52.

Figure 19:
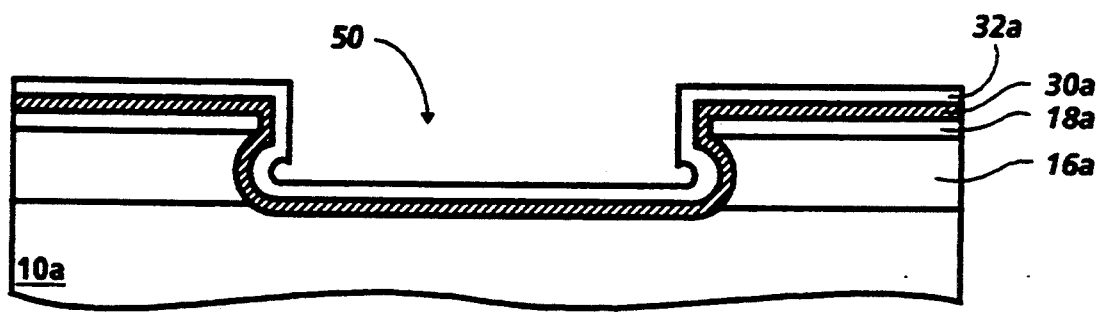
FIG. 19 shows a cross sectional view of the substrate of FIG. 18 after deposition of a first sacrificial layer and of a bushing layer.
Figure 20:
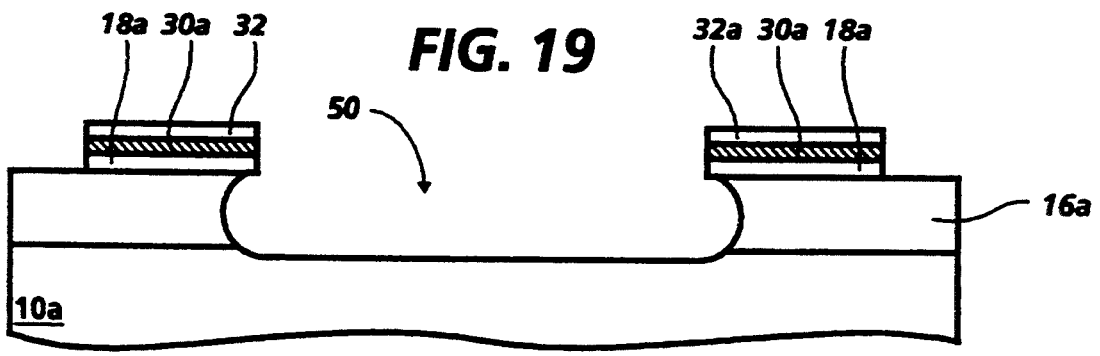
FIG. 20 shows a cross sectional view of the substrate of FIG. 20 after patterning the first sacrificial layer and the bushing layer.

The next step is covering the recessed pin 28a with a sacrificial layer 30a and a bushing layer 32a as shown in FIG. 19. FIG. 20 shows patterning of the bushing layer 32a to form two bushings 32a.

Figure 21:
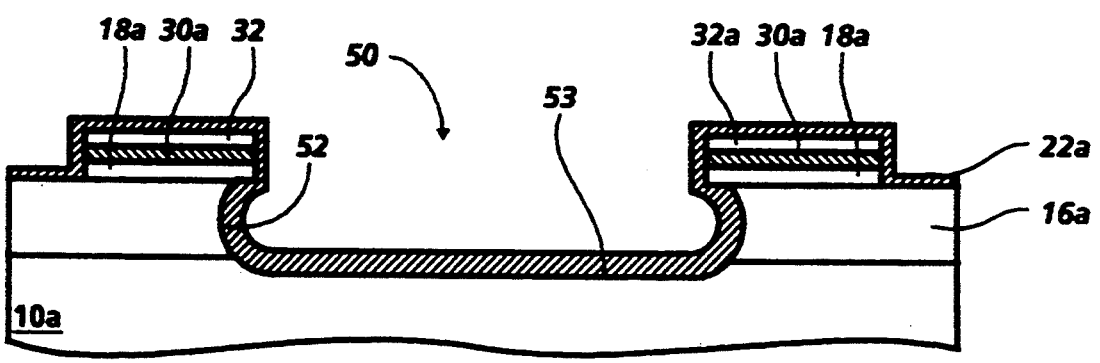
FIG. 21 shows a cross sectional view of the substrate of FIG. 21 after formation of a second sacrificial layer.
Figure 22:
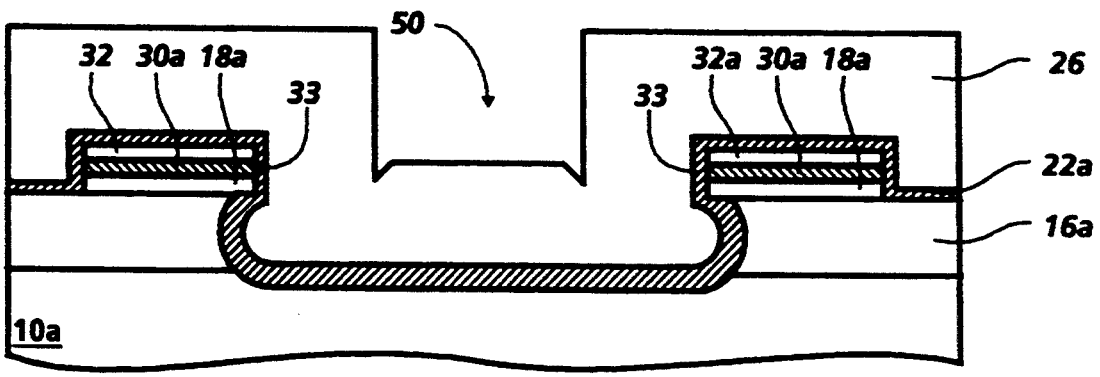
FIG. 22 shows a cross sectional view of the substrate of FIG. 22 after deposition of a second structural layer.

The next step is covering the bottom surface 53 and the wall 52 of the depression 50 with a sacrificial layer 22a as shown in FIG. 21. Deposition and patterning of the second structural layer 24a, as shown in FIGS. 22, is identical to FIGS. 10 and 11.

Figure 23:
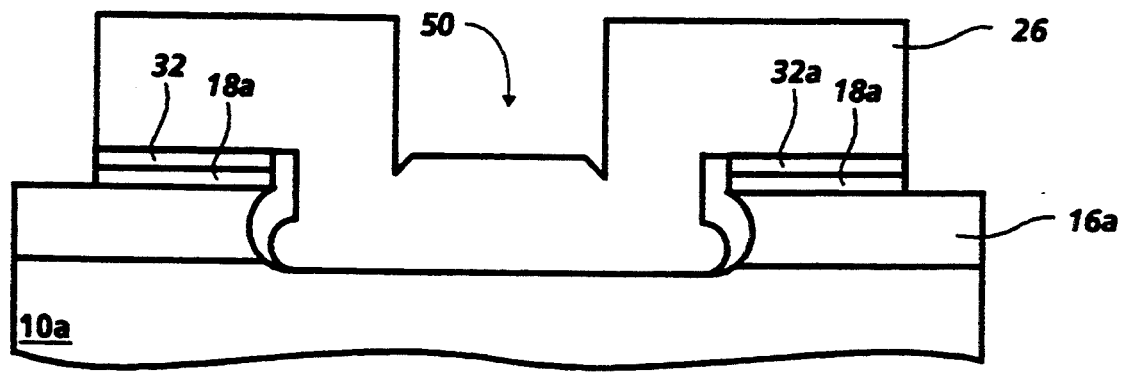
FIG. 23 is a cross sectional view of a completed gear from the sequence of process steps shown in FIGS. 15-23 after patterning the second structural layer and removing the sacrificial layers.
Figure 24:
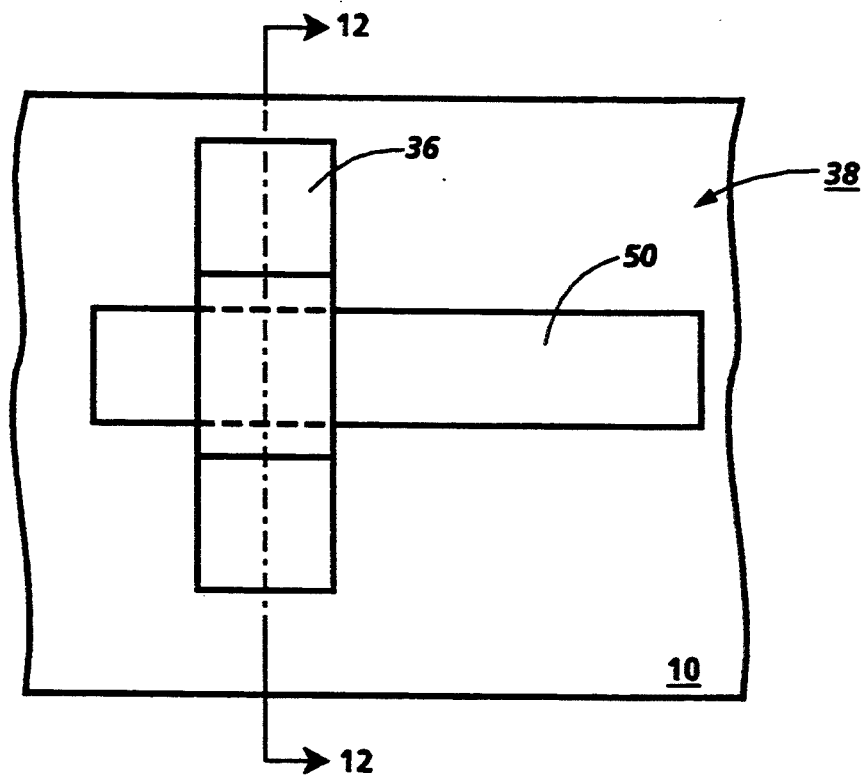
FIG. 24 shows a top view of a gear on a slider.

The final step, shown in FIG. 23, is an oxide etch to wash out both sacrificial layers 30a, 22a. This step frees the gear 26a from the depression 50 and the substrate 10a. The gear 26a may now rotate freely around the depression 50. This step also frees the bushings 32a sandwiched between the two sacrificial layers 22a, 30a. The bushings 32a are now trapped between the gear 26a and the substrate 10 a but able to move freely. Due to the single step process of depositing a sacrificial layer the gear 26a is not suspended above the substrate as in the previous sequence and thus two bushings are used.

Other variations of the process for making the stationary structure are also contemplated including eliminating the nitride layer 14 and patterning and etching the substrate 10 itself to form the structures formed from the first structural layer 12, 12a. These processes have been described in applicant's U.S. applications Ser. No. 07/725,174 Fabrication Methods for Micromechanical Elements issued as U.S. Pat. No. 5,149,397 and Ser. No. 07/725,176 Manufacture of a Suspended Micromechanical Element issued as U.S. Pat. No. 5,157,153, both filed Jul. 3, 1991 and are expressly incorporated herein.

It is important to note that while the structures described have been rotating structures, the process is also applicable to sliding structures. FIG. 26 shows a top view of such a sliding structure. The depression 50 would be an elongated slot with the sliding element 36 moving in the depression 50. The cross section taken through line 12—12, as well as the process steps, would be identical to those described above.

While the present invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

What is claimed is:

1. A process for making micromechanical structures with bushings comprising:

providing a member having a first generally planar surface and a second generally planar surface extending generally parallel to said first generally planar surface, wall means extending between and joining said first and second generally planar surfaces, forming a first sacrificial layer on said wall means and said first generally planar surface, forming a bushing layer on said first sacrificial layer, forming a second sacrificial layer on top of said bushing layer, said wall means, and on at least a portion of said second generally planar surface, forming a structural layer on top of at least a portion of said second sacrificial layer, patterning said structural layer to form a moving structure for movement relative to said member and exposing portions of said second sacrificial layer, and removing said first and second sacrificial layers to release said moving structure from said member and to release said bushing layer from said moving structure and said member and allowing relative movement between said moving structure, said member, and said bushing layer.

2. The process of claim 1, wherein said second sacrificial layer is formed on top of said second generally planar surface to be thicker than the combination of said first sacrificial layer on top of said first generally planar surface and said second sacrificial layer on top of said bushing layer whereby said moving structure is spaced from said second generally planar surface and contacts said bushing layer when said first and second sacrificial layers are removed.

3. The process of claim 2, wherein said wall means is on a structure protruding from said second generally planar surface and said first generally planar surface is on the protruding structure.

4. The process of claim 3, wherein said protruding structure is elongated and said structural layer has a slot receiving said protruding structure.

5. The process of claim 4 wherein said wall means has a generally concave surface.

6. The process of claim 2 wherein said wall means and said second generally planar surface define a depression in said member.

7. The process of claim 6 wherein said wall means is annular and said structural layer has a protrusion extending into said depression.

8. The process of claim 7 wherein said depression is elongated and said protrusion of said structural layer is elongated.

9. The process of claim 6 wherein said wall means has a generally concave surface.

10. The process of claim 7 wherein said wall means has a generally concave surface.

11. The process of claim 8 wherein said wall means has a generally concave surface.

12. The process of claim 1 wherein said first and second sacrificial layers are comprised of a silicon oxide and said bushing layer is comprised of a silicon nitride.

13. The process of claim 12 wherein said second generally planar surface and said wall means extending between and joining said first and second generally planar surfaces are comprised of two layers:
A) a first polysilicon layer on said first generally planar surface;
B) a nitride layer on said first polysilicon layer, and said wall means having a generally concave surface.

14. The process of claim 2 wherein said first and second sacrificial layers are comprised of a silicon oxide and said bushing layer is comprised of a silicon nitride.

15. The process of claim 14 wherein said second generally planar surface and said wall means extending between and joining said first and second generally planar surfaces are comprised of two layers:
A) a first polysilicon layer on said first generally planar surface;
B) a nitride layer on said first polysilicon layer, and said wall means having a generally concave surface.

* * * * *